(12) United States Patent
Gao

(10) Patent No.: US 12,349,301 B2
(45) Date of Patent: Jul. 1, 2025

(54) METHOD OF MANUFACTURING TILED DISPLAY SCREEN, AND TILED DISPLAY SCREEN

(71) Applicant: BOE Technology Group Co., Ltd., Beijing (CN)

(72) Inventor: Meiling Gao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 196 days.

(21) Appl. No.: 17/912,387

(22) PCT Filed: Nov. 9, 2021

(86) PCT No.: PCT/CN2021/129589
§ 371 (c)(1),
(2) Date: Sep. 16, 2022

(87) PCT Pub. No.: WO2022/179182
PCT Pub. Date: Sep. 1, 2022

(65) Prior Publication Data
US 2023/0209737 A1 Jun. 29, 2023

(30) Foreign Application Priority Data
Feb. 26, 2021 (CN) .......................... 202110219625.7

(51) Int. Cl.
H05K 5/00 (2025.01)
H05K 5/03 (2006.01)
H05K 5/30 (2025.01)

(52) U.S. Cl.
CPC ................. *H05K 5/30* (2025.01); *H05K 5/03* (2013.01)

(58) Field of Classification Search
CPC .......... H05K 5/30; H05K 5/03; G09F 9/3026; G09F 9/302
See application file for complete search history.

(56) References Cited

U.S. PATENT DOCUMENTS

2007/0001927 A1* 1/2007 Ricks .................... G09F 9/3026
345/1.1
2017/0084879 A1 3/2017 Wen et al.
(Continued)

FOREIGN PATENT DOCUMENTS

CN 102945644 A 2/2013
CN 105761635 A 7/2016
(Continued)

OTHER PUBLICATIONS

CN 202110219625.7 first office action.
PCT/CN2021/129589 international search report and written opinion.

*Primary Examiner* — Daniel McNally
(74) *Attorney, Agent, or Firm* — IPro, PLLC

(57) ABSTRACT

Provided are method of manufacturing tiled display screen, and tiled display screen. The method includes: providing display panels, each display panel includes a first frame area at the periphery of a display area and a reserved cutting frame area at the periphery of the first frame area; attaching a protective cover plate to the display panel to form a sub-display module, the protective cover plate includes a second frame area at the periphery of the display area, a frame width of the first frame area is greater than or equal to that of the second frame area; performing a second cutting on the sub-display module, with a cutting line being a boundary line between the first frame area and the reserved cutting frame area, and removing the reserved cutting frame area to obtain a sub-display screen; and tiling sub-display screens.

8 Claims, 4 Drawing Sheets

(56) References Cited

U.S. PATENT DOCUMENTS

| | | | |
|---|---|---|---|
| 2020/0201115 A1 | 6/2020 | Ko | |
| 2021/0226149 A1 | 7/2021 | Luo et al. | |
| 2021/0234136 A1* | 7/2021 | Zhang | H10K 71/00 |
| 2022/0223628 A1 | 7/2022 | Li | |
| 2022/0328463 A1* | 10/2022 | Kim | H10K 50/865 |

FOREIGN PATENT DOCUMENTS

| | | |
|---|---|---|
| CN | 109216586 A | 1/2019 |
| CN | 109782938 A | 5/2019 |
| CN | 109884814 A | 6/2019 |
| CN | 110211999 A | 9/2019 |
| CN | 110473983 A | 11/2019 |
| CN | 110883439 A | 3/2020 |
| CN | 110989238 A | 4/2020 |
| CN | 111090188 A | 5/2020 |
| CN | 112018045 A | 12/2020 |
| CN | 112863371 A | 5/2021 |
| WO | 2019095630 A1 | 5/2019 |

* cited by examiner

METHOD OF MANUFACTURING TILED DISPLAY SCREEN, AND TILED DISPLAY SCREEN

CROSS-REFERENCE TO RELATED APPLICATIONS

The present application is the U.S. national phase of PCT Application No. PCT/CN2021/129589 filed on Nov. 9, 2021, which claims priority to Chinese Patent Application No. 202110219625.7 filed in China on Feb. 26, 2021, the disclosure of which is hereby incorporated by reference in its entirety.

TECHNICAL FIELD

The present disclosure relates to the technical field of display, and in particular, to a method of manufacturing a tiled display screen and a tiled display screen.

BACKGROUND

Tiled display is a method for realizing a large-size display. Compared with conventional single large-size display, tiled display has advantages such as high yield, good reliability and unlimited tiled size. In the related art, there is a problem that the seam is large to affect the display effect for the tiled display screen.

SUMMARY

Embodiments of the present disclosure provide a method of manufacturing a tiled display screen and a tiled display screen, which can reduce the seam to improve the display effect.

The present disclosure provides the following technical solution.

An embodiment of the present disclosure further provides a method of manufacturing a tiled display screen, the method includes:

providing a parent panel, and performing a first cutting on the parent panel to obtain a plurality of display panels, wherein each of the plurality of display panels includes a first frame area at the periphery of a display area and a reserved cutting frame area at the periphery of the first frame area;

providing a protective cover plate;

attaching the protective cover plate to one of the plurality of display panels to form a display sub-module, wherein the protective cover plate includes a second frame area at the periphery of the display area, and a frame width of the first frame area is greater than or equal to a frame width of the second frame area;

performing a second cutting on the display sub-module, with a cutting line of the second cutting being a boundary line between the first frame area and the reserved cutting frame area, and removing the reserved cutting frame area to obtain a sub-display screen; and tiling a plurality of sub-display screens including the obtained sub-display screen to obtain the tiled display screen.

Illustratively, after attaching the protective cover plate to the display panel to form a display sub-module, and before performing a second cutting on the display sub-module, the method further includes:

coating a first region, the reserved cutting frame area and a side face of an edge of the protective cover plate with an adhesive to form an adhesive coating layer, where the first frame area of the display panel includes the first region which exceeds the edge of the protective cover plate at a side face facing towards the protective cover plate, and curing the adhesive coating layer.

Illustratively, in the method, the performing a second cutting on the display sub-module, with a cutting line of the second cutting being a boundary line between the first frame area and the reserved cutting frame area, and removing the reserved cutting frame area to obtain a sub-display screen, specifically includes:

performing one-shot cutting on the display panel and the cured adhesive coating layer to remove the reserved cutting frame area and a part of the adhesive coating layer corresponding to the reserved cutting frame area, so as to obtain the sub-display screen, wherein a side face of an outer edge of the adhesive coating layer obtained after the second cutting is performed is flush with an outer edge of the first frame area of the display panel.

Illustratively, in the method, after the performing a second cutting on the display sub-module and before the tiling a plurality of sub-display screens, the method further includes:

coating a first region, a side face of an outer edge of the protective cover plate and a side face of an outer frame of the display panel with an adhesive to form an adhesive coating layer, where the first frame area of the display panel includes the first region which exceeds an edge of the protective cover plate at a side face facing towards the protective cover plate, and curing the adhesive coating layer.

Illustratively, the frame width of the first frame area is 0.2 mm to 1.0 mm greater than the frame width of the second frame area.

An embodiment of the present disclosure further provides a tiled display screen, including at least two sub-display screens tiled to one another, wherein each sub-display screen includes a display panel and a protective cover plate attached to one another, the sub-display screen includes a display area, the display panel includes a first frame area at the periphery of the display area, and the protective cover plate includes a second frame area at the periphery of the display area; a frame width of the first frame area is greater than or equal to a frame width of the second frame area.

Illustratively, the frame width of the first frame area is 0.2 mm to 1.0 mm greater than the frame width of the second frame area.

Illustratively, the first frame area of the display panel includes a first region exceeding an edge of the protective cover plate at a side face facing towards the protective cover plate, and the first region and a side face of the edge of the protective cover plate is coated with an adhesive coating layer.

Illustratively, a side face of an outer edge of the adhesive coating layer is flush with a side face of an outer edge of the first frame area of the display panel; or, the adhesive coating layer is further coated on a side face of an outer edge of the display panel.

Illustratively, a width D of a seam between the at least two sub-display screens that are tiled to one another meets: $D=D1+D2+D\Delta$, wherein D1 is a frame width of a first frame area in one of two adjacent sub-display panels; D2 is a frame width of a first frame area of the other one of the two adjacent sub-display panels; $D\Delta$ is a tolerance for a tiled assembly of the two adjacent sub-display screens.

The embodiments of present disclosure provide the following beneficial effects.

According to the method of manufacturing the tiled display screen and the tiled display screen provided by the embodiments of the present disclosure, by designing the size of the second frame area of the protective cover plate in the sub-display screen to be narrower than the size of the first frame area of the display panel, that is to say, the outer boundary of the protective cover plate is recessed inwardly. Comparing with the solution in the related art in which the protective cover plate is designed to extend outwardly, the width of the seam can be reduced and a narrow frame can be achieved, and thereby the display effect can be improved.

DETAILED DESCRIPTION

To make the object, technical solution and advantages of the embodiments of the present disclosure more clear, a detailed description for the embodiments of the present disclosure will be illustrated in conjunction with the appended drawings. It is to be understood that the described embodiments are merely some, but not all, of the embodiments of the present disclosure. Based on the embodiments described in the present disclosure, all other embodiments obtained by a person of ordinary skill in the art without inventive effort fall within the scope of the present disclosure.

Unless defined otherwise, technical or scientific terms used in this disclosure shall have the ordinary meaning as understood by one of ordinary skill in the art to which this disclosure belongs. The terms "first", "second", and the like as use herein do not denote any order, quantity, or importance, but rather are used to distinguish one element from another. Likewise, terms such as "a", "an", or "the" do not denote a limitation of quantity, but rather denote the presence of at least one referenced item. The terms "include" or "comprise", and the like, means that the presence of an element or item preceding the word encompasses the presence of the element or item listed after the word and equivalents thereof, but does not exclude other elements or items. The terms "connect" or "link" and the like are not limited to physical or mechanical connections, but may include an electrical connection, whether direct or indirect. The terms "upper", "lower", "left", "right" and the like are used only to indicate relative positional relationships that may change accordingly when the absolute position of the object being described changes.

Before describing in detail the method of manufacturing the tiled display screen, and the tiled display screen provided by the embodiments of the present disclosure, the related techniques are described first as follows.

Figure 1:
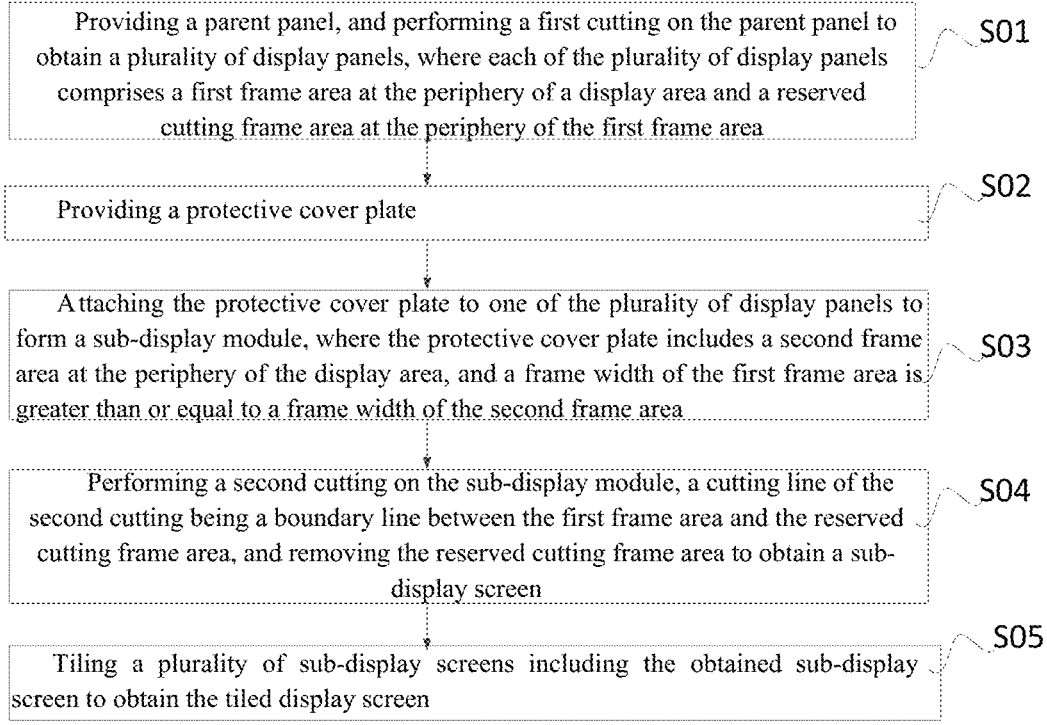
FIG. 1 shows a flowchart of a method of manufacturing a tiled display screen in accordance with an embodiment of the present disclosure.
Figure 2:
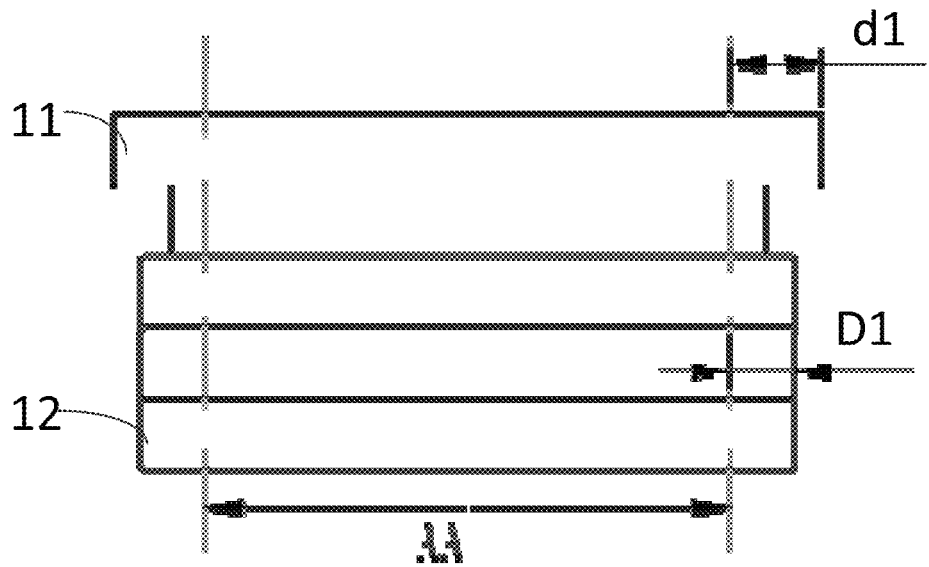
FIG. 2 shows a schematic diagram of a sub-display screen in a tiled display screen in the related art.
Figure 3:
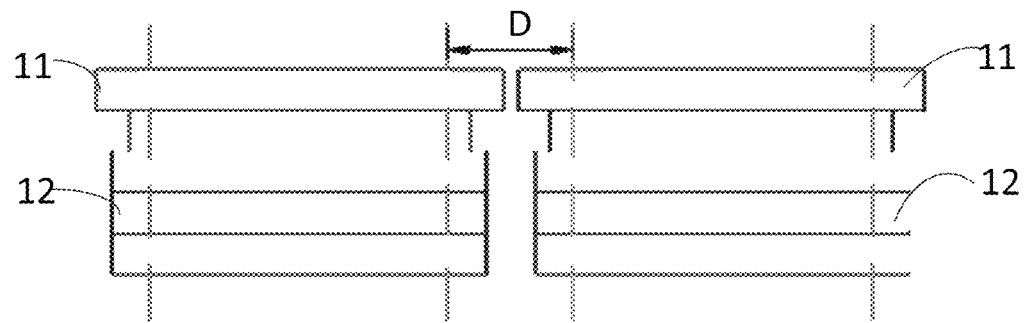
FIG. 3 shows a schematic diagram of a tiled display screen in the related art.

In the related art, a tiled display screen includes at least two sub-display screens tiled to one another, and a glass material is usually used as a surface covering layer, namely, a protective cover plate 11, in the tiled display screen to ensure the reliability of the whole display module. The manufacturing process of the sub-display screen is as follows. Firstly, a first cutting is performed on a parent panel to obtain a plurality of display panels 12, then one of the display panels 12 and the protective cover plate 11 are attached to one another to obtain a display sub-module, and a second cutting is performed on the display sub-module to obtain a sub-display screen. For the second cutting, one-shot cutting by using a laser is generally adopted. However, since the glass thickness of the protective cover plate 11 is relatively thick (about 0.4 mm to 0.7 mm), the one-shot cutting by using the laser cannot be performed on the display sub-module. When the protective cover plate 11 is subjected to the attaching, the protective cover plate 11 is outwardly extended with respect to the display panel so as to reserve an attaching tolerance, as shown in FIG. 2. This results in that the frame size of the whole sub-display screen is the size d of the outwardly extended frame of the protective cover plate 11, which is larger than the frame sized D1 designed for the display panel 12. After tiling such sub-display screens together, the seam is relatively large, and the display effect is disadvantageously affected.

In order to address the issue described above, embodiments of the present disclosure provide a method of manufacturing a tiled display screen and a tiled display screen, which can reduce the seam to improve the display effect.

Referring to FIG. 1, and FIGS. 4-8, an embodiment of the present disclosure provides a method of manufacturing a tiled display screen, including the following steps.

At step S01, a parent panel is provided, and a first cutting is performed on the parent panel to obtain a plurality of display panels, where the display panel 100 includes a first frame area 110 at the periphery of a display area and a reserved cutting frame area 120 at the periphery of the first frame area 110.

Figure 4:
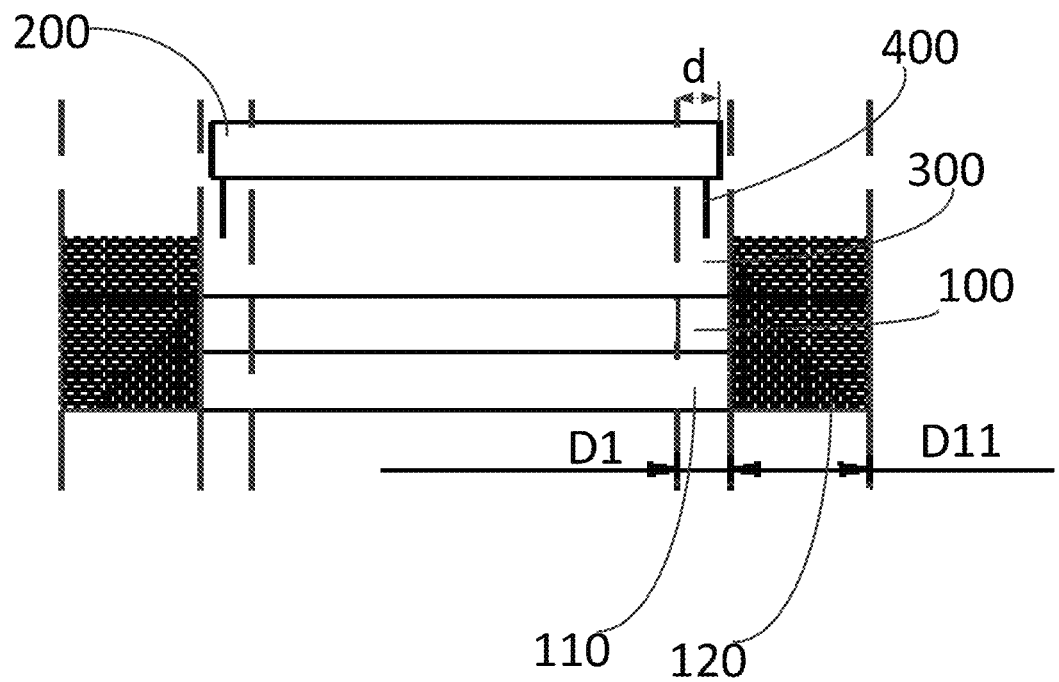
FIG. 4 shows a schematic diagram of step S03 in a method of manufacturing a tiled display screen as provided in an embodiment of the present disclosure.
Figure 5:
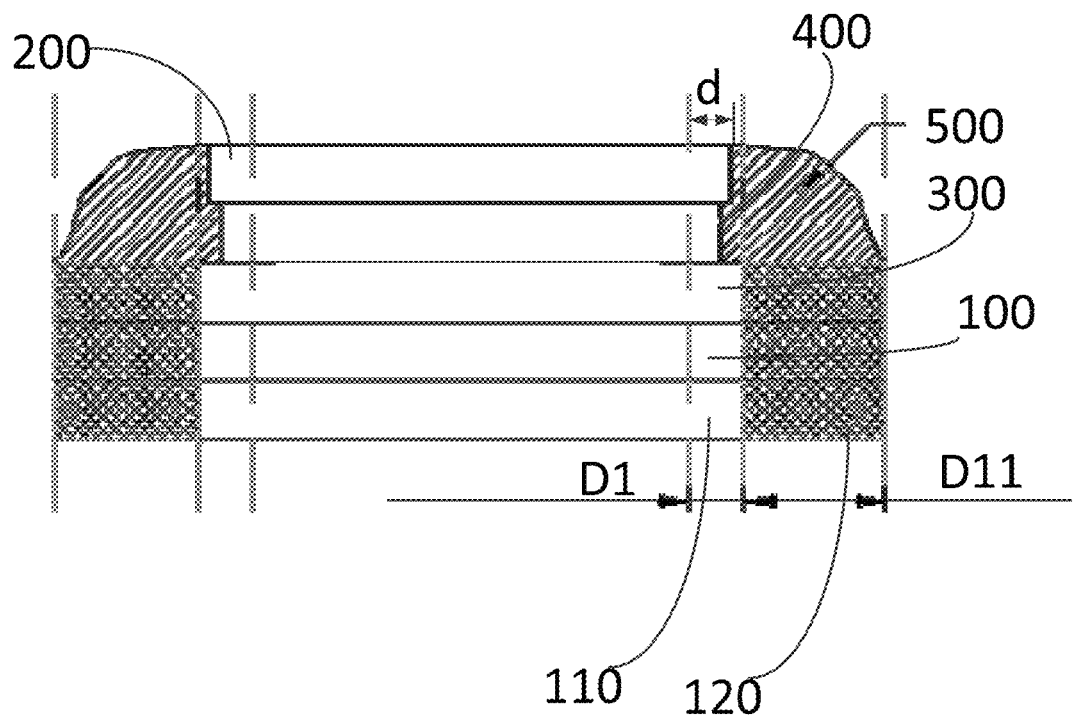
FIG. 5 shows a schematic diagram of step S031 in a method of manufacturing a tiled display screen as provided in an embodiment of the present disclosure.

The parent panel is generally a large panel. After the display panel 100 is manufactured on the parent panel, a plurality of display panels 100 are obtained by one-shot cutting performed on the parent panel, where each display panel 100 may include a base substrate, display units arranged on the base substrate, etc. A frame area is provided at the periphery of the display area AA in the display panel 100, and the frame area is divided into a first frame area 110 and a reserved cutting frame area 120. The reserved cutting frame area 120 is removed by cutting during a second cutting. As shown in FIGS. 4 and 5, the width of the reserved cutting frame area 120 is D11.

At step S02, a protective cover plate 200 is provided.

The protective cover plate 200 may be made of glass, and the thickness thereof may be 0.4 mm to 0.7 mm. However, the specific material and thickness of the protective cover plate 200 are not limited thereto.

At step S03, the protective cover plate 200 and the display panel 100 are attached to one another to form a display sub-module. As shown in FIG. 4, the protective cover plate 200 includes a second frame area 210 at the periphery of the display area AA, and a frame width D1 of the first frame area 110 is greater than or equal to a frame width d of the second frame area 210.

The protective cover plate 200 may be attached to a light-emitting side of the display panel 100. As shown in FIG. 4, a polarizer 300 and the like may also be arranged at the light-emitting side of the display panel 100. The attaching between the display panel 100 and the protective cover plate 200 is achieved by means of an optical adhesive 400. The second frame area 210 at the periphery of the display area AA of the protective cover plate 200 is narrower than the first frame area 110 of the display panel 100, that is to say, the protective cover plate 200 is designed to be not extending outwardly.

Figure 6:
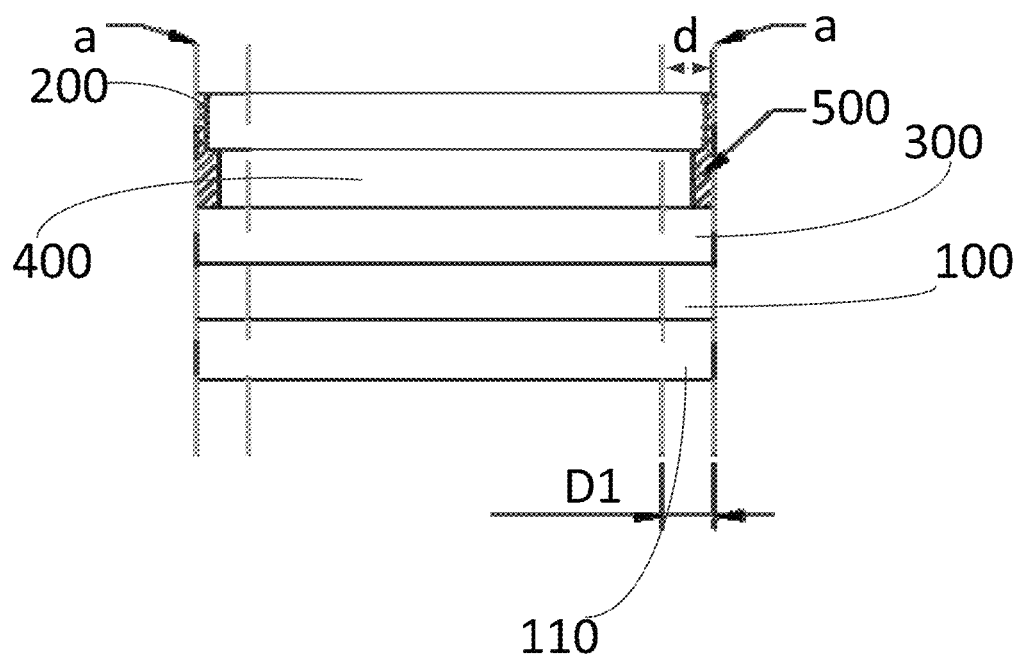
FIG. 6 shows a schematic diagram of step S04 in a method of manufacturing a tiled display screen as provided in an embodiment of the present disclosure.

At step S04, as shown in FIG. 6, a second cutting is performed on the display sub-module, with a cutting line of the second cutting being a boundary line between the first frame area 110 and the reserved cutting frame area 120, and then the reserved cutting frame area 120 is removed to obtain a sub-display screen.

A one-shot cutting may be performed on the display sub-module by using laser cutting. As the protective cover plate 200 is designed to be not extending outwardly, there is no need to cut the protective cover plate 200 during the laser cutting, and the cutting is performed along the boundary line between the first frame area 110 and the reserved cutting frame area 120 of the display panel 100, so that the reserved cutting frame area 120 is removed.

At step S05, a plurality of sub-display screens are tiled to obtain the tiled display screen.

As shown in FIGS. 4 to 8, as the protective cover plate 200 is not extending outwardly, the frame size of the whole sub-display screen is the frame size of the first frame area 110 of the display panel 100. Therefore, a width D of a seam of the display screen meets: $D=D1+D2+D\Delta$, where D1 is a frame width of the first frame area 110 in one of two adjacent sub-display panels; D2 is a frame width of the first frame area 110 in the other one of the two adjacent sub-display panels; $D\Delta$ is a tolerance for the tiled assembly of the two adjacent sub-display screens.

In the related art, a width D' of a seam in a tiled display screen meets: $D'=+D2'+D\Delta$, where Dr is a width of an outwardly extending frame of the protective cover plate in one of two adjacent sub-display screens; D2' is a width of an outwardly extending frame of the protective cover plate in the other one of the two adjacent sub-display screens; $D\Delta$ is a tolerance for the tiled assembly of the two adjacent sub-display screens, in which Dr is greater than D1, and D2' is greater than D2.

It can be seen from the above, when compared with the solution in the related art in which the protective cover plate is designed to be extending outwardly, by designing the size of the second frame area 210 of the protective cover plate 200 in the sub-display screen to be narrower than the size of the first frame area 110 of the display panel 100, that is to say, the size of the outer boundary of the protective cover plate 200 is reduced. The width of the seam can be reduced and a narrow frame can be realized, and the display effect can be improved when compared with the solution in the related art in which the protective cover plate 200 is designed to be extending outwardly.

In the embodiments of the present disclosure, due to the design in which the protective cover plate 200 is recessed inwardly, in each sub-display screen, a certain blank region may exist between the outer edge of the display panel 100 and the outer edge of the protective cover plate 200. That is to say, as shown in FIG. 5, the first frame area 110 of the display panel 100 includes a first region exceeding the edge of the protective cover plate 200 at a side face of the first frame area 110 facing towards the protective cover plate 200, and the first region may be filled with an a glue to form an adhesive coating layer 500.

Illustratively, the adhesive coating layer 500 may be formed with two manners including the first manner and the second manner.

For the first manner, the method further includes the following step S031 after the above-mentioned step S03 and before the step S04.

At step S031, as shown in FIGS. 5 and 6, the first region, the reserved cutting frame area 120 and the side face of the edge of the protective cover plate 200 are coated with an adhesive to form an adhesive coating layer 500, and the adhesive coating layer 500 is cured.

Furthermore, in the present exemplary embodiment, in the above-mentioned step S04, when performing the second cutting on the display sub-module, one-shot cutting is performed on the display panel 100 and the cured adhesive coating layer 500 to remove the reserved cutting frame area 120 and a part of the adhesive coating layer 500 corresponding to the reserved cutting frame area 120, so as to obtain the sub-display screen, where a side face of an outer edge of the adhesive coating layer 500 obtained after the second cutting has been performed is flush with a side face of an outer edge of the first frame area 110 of the display panel 100.

It can be seen form the above, in the method of manufacturing the tiled display screen provided by the embodiments of the present disclosure, by designing the protective cover plate 200 to have a reduced size in its outline, filling the region from the outer edge of the protective cover plate 200 to the outer edge of the display panel 100 with the adhesive, curing the adhesive at a low temperature to form the adhesive coating layer 500, and then performing the one-shot cutting on both the adhesive coating layer 500 and the display panel 100 with laser, a narrow frame requirement can be satisfied.

For the second manner, after the above-mentioned step S04 and before the step S05, the method further includes a step S041.

Figure 8:
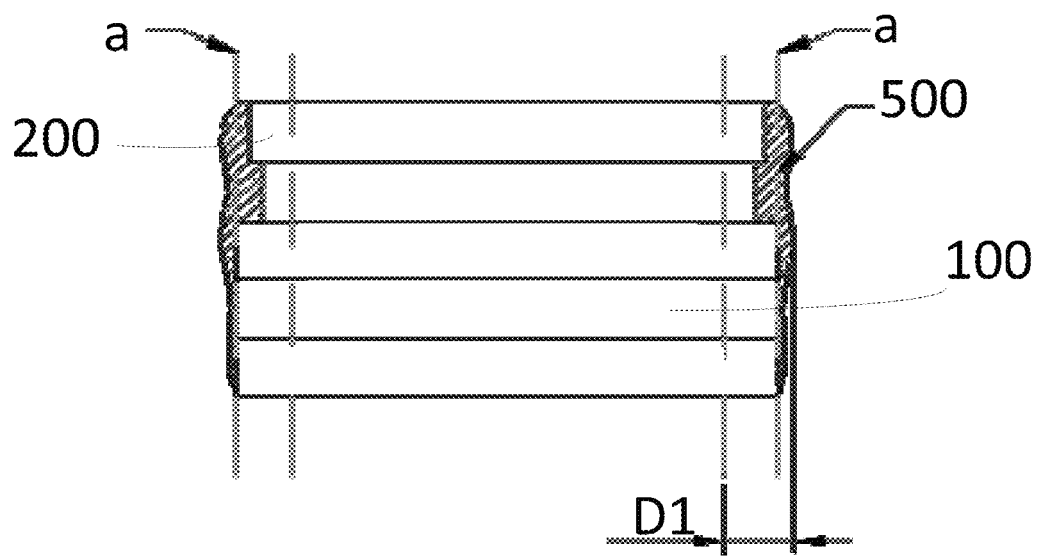
FIG. 8 shows a schematic diagram of a tiled display screen provided by some other embodiments of the present disclosure.

At step S041, as shown in FIG. 8, a first region, a side face of an outer edge of the protective cover plate 200 and a side face of an outer frame of the display panel 100 are coated with an adhesive to form an adhesive coating layer 500, and the adhesive coating layer 500 is cured, so that the display panel 100 is protected by the adhesive coating layer 500.

It should be understood that the above manners are merely exemplary illustrations of specific implementations of the adhesive coating layer 500, and in practical application, the implementation of the adhesive coating layer 500 is not limited thereto.

Furthermore, in some exemplary embodiments, as shown in FIG. 4, the frame width of the first frame area 110 is 0.2 mm to 1.0 mm greater than the frame width of the second frame area 210, i.e. the protective cover 200 is recessed inwardly by a distance of 0.2 mm to 1.0 mm.

Furthermore, an embodiment of the present disclosure further provides a tiled display screen, the tiled display screen may be manufactured by the method of manufacturing the tiled display screen provided by the embodiments of the present disclosure.

Figure 7:
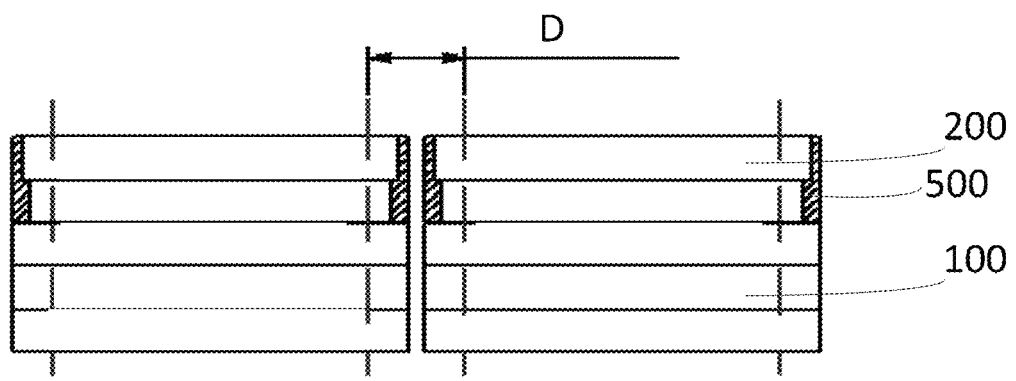
FIG. 7 shows a schematic diagram of a tiled display screen provided by some embodiments of the present disclosure.

As shown in FIG. 7, the tiled display screen includes at least two sub-display screens tiled to one another. Each sub-display screen includes a display panel 100 and a protective cover plate 200 attached to one another, the sub-display screen includes a display area AA, the display panel 100 includes a first frame area 110 at the periphery of the display area, and the protective cover plate 200 includes a second frame area 210 at the periphery of the display area AA; a frame width of the first frame area 110 is greater than or equal to a frame width of the second frame area 210.

It can be seen from the above, when compared with the solution in the related art in which the protective cover plate 200 is designed to be extending outwardly, by designing the size of the second frame area 210 of the protective cover plate 200 in the sub-display screen to be narrower than the size of the first frame area 110 of the display panel 100, that is to say, by designing the protective cover plate 200 to have a reduced size in its outline, the width of the seam can be reduced, a narrow frame can be realized, and the display effect can be improved when compared with the solution in the related art in which the protective cover plate 200 is designed to be extending outwardly.

In some exemplary embodiments, the frame width of the first frame area 110 is 0.2 mm to 1.0 mm greater than the frame width of the second frame area 210. That is, the protective cover plate 200 is recessed inwardly by a distance of 0.2 mm to 1.0 mm. It will be understood that the distance by which the protective cover plate 200 is recessed inwardly is not limited thereto.

In some exemplary embodiments, the first frame area 110 of the display panel 100 includes a first region exceeding an edge of the protective cover plate 200 at a side face of the first frame area 110 facing towards the protective cover plate 200, and the first region and a side face of the edge of the protective cover plate 200 is coated with an adhesive coating layer 500.

In the above technical solution, since the protective cover plate 200 is designed to be recessed inwardly, in each sub-display screen, a certain empty region may exist between the outer edge of the display panel 100 and the outer edge of the protective cover plate 200. That is to say, as shown in FIG. 5, the first frame area 110 of the display panel 100 includes a first region exceeding the edge of the protective cover plate 200 at a side face facing to the protective cover plate 200, and the first region may be filled with a glue to form an adhesive coating layer 500.

Further, in some exemplary embodiments, as shown in FIG. 7, the side face of the outer edge of the adhesive coating layer 500 is flush with the side face of the outer edge of the first frame area 110 of the display panel 100. Here, the side face of the outer edge of the adhesive coating layer 500 refers to a side face of an edge of the adhesive coating layer at a side away from the display area, and the side face of the outer edge of the first frame area of the display panel refers to a side face of an edge of the first frame area of the display panel at a side away from the display area.

Further, in some other exemplary embodiments, as shown in FIG. 8, the adhesive coating layer 500 is also applied to the side face of the outer edge of the display panel 100.

In the tiled display screen provided by the embodiments of the present disclosure, a width D of a seam between the at least two sub-display screens that are tiled to one another meets: $D=D_1+D_2+D\Delta$, wherein $D_1$ is a frame width of the first frame area 110 in one sub-display screen of two adjacent sub-display panels; $D_2$ is a frame width of the first frame area 110 of the other sub-display screen of the two adjacent sub-display panels; $D\Delta$ is a tolerance for the tiled assembly of the two adjacent sub-display screens.

A width D' of a seam of a tiled display screen in the related art meets: $D'=+D_2'+D\Delta$, where Dr is a width of an outwardly extending frame of the protective cover plate in one sub-display screen of two adjacent sub-display screens; $D_2'$ is a width of an outwardly extending frame of the protective cover plate in the other sub-display screen of the two adjacent sub-display screens; $D\Delta$ is a tolerance for the tiled assembly of two adjacent sub-display screens. Since Dr is greater than $D_1$ and $D_2'$ is greater than $D_2$, the tiled display screen provided by the present disclosure may have a seam with a reduced size, and have an improved display effect when compared with the solution in the related art in which the protective cover plate is designed to extend outwardly.

The following points need to be explained:

(1) The drawings merely illustrate the structures to which the embodiments of the present disclosure relate, and other structures may refer to general designs;

(2) In the drawings for describing embodiments of the present disclosure, the thickness of layers or regions is exaggerated or reduced for the purpose of illustration, i.e. the drawings are not drawn to scale. It will be understood that when an element such as a layer, film, region or substrate is referred to as being "on" or "under" another element, it can be "directly on" or "directly under" the other element or any intervening element may be present therebetween.

(3) Embodiments of the present disclosure and features in the embodiments may be combined with each other to provide new embodiments if there is not conflict.

The foregoing illustrates specific embodiments of the present disclosure, but the scope of the disclosure is not limited thereto. The scope of the disclosure is set forth in the appended claims.

What is claimed is:

1. A method of manufacturing a tiled display screen, comprising:
    providing a parent panel, and performing a first cutting on the parent panel to obtain a plurality of display panels, wherein each of the plurality of display panels comprises a first frame area at the periphery of a display area and a reserved cutting frame area at the periphery of the first frame area;
    performing following operations on each of the plurality of display panels to obtain a plurality of sub-display screens:
    providing a protective cover plate;
        attaching the protective cover plate onto a top surface of the display panel to form a display sub-module, wherein the protective cover plate comprises a second frame area at the periphery of the display area, and a frame width of the first frame area is greater than a frame width of the second frame area; wherein the frame width of the first frame area is 0.2 mm to 1.0 mm greater than the frame width of the second frame area;
        performing a second cutting on the display sub-module, with a cutting line of the second cutting being a boundary line between the first frame area and the reserved cutting frame area, and removing the reserved cutting frame area to obtain the sub-display screen; and
    tiling the plurality of sub-display screens each including the obtained sub-display screen to obtain the tiled display screen.

2. The method of manufacturing the tiled display screen according to claim 1, wherein,
    after the attaching the protective cover plate onto a top surface of the display panel to form a display sub-module, and before the performing a second cutting on the display sub-module, the method further comprises:

coating a first region, the reserved cutting frame area and a side face of an edge of the protective cover plate with an adhesive to form an adhesive coating layer, and curing the adhesive coating layer, wherein the first frame area of the display panel comprises the first region which exceeds the edge of the protective cover plate at a side face facing towards the protective cover plate.

3. The method of manufacturing the tiled display screen according to claim 2, wherein, the performing a second cutting on the display sub-module, with a cutting line of the second cutting being a boundary line between the first frame area and the reserved cutting frame area, and removing the reserved cutting frame area to obtain a sub-display screen, comprises:

performing one-shot cutting on the display panel and the cured adhesive coating layer to remove the reserved cutting frame area and a part of the adhesive coating layer corresponding to the reserved cutting frame area, so as to obtain the sub-display screen, wherein an outer edge of the adhesive coating layer obtained after the second cutting is performed is flush with an outer edge of the first frame area of the display panel.

4. The method of manufacturing the tiled display screen according to claim 1, wherein, after the performing a second cutting on the display sub-module, and before the tiling a plurality of sub-display screens, the method further comprises:

coating a first region, a side face of an outer edge of the protective cover plate and a side face of an outer frame of the display panel with an adhesive to form an adhesive coating layer, and curing the adhesive coating layer, where the first frame area of the display panel comprises the first region which exceeds an edge of the protective cover plate at a side face facing towards the protective cover plate.

5. A tiled display screen, comprising: at least two sub-display screens tiled to one another, wherein each sub-display screen comprises a display panel and a protective cover plate attached onto a top surface of the display panel, each sub-display screen comprises a display area, the display panel comprises a first frame area at the periphery of the display area, and the protective cover plate comprises a second frame area at the periphery of the display area; wherein a frame width of the first frame area is greater than a frame width of the second frame area; wherein the frame width of the first frame area is 0.2 mm to 1.0 mm greater than the frame width of the second frame area.

6. The tiled display screen according to claim 5, wherein, the first frame area of the display panel comprises a first region exceeding an edge of the protective cover plate at a side face facing towards the protective cover plate, and the first region and a side face of the edge of the protective cover plate is coated with an adhesive coating layer.

7. The tiled display screen according to claim 6, wherein, a side face of an outer edge of the adhesive coating layer is flush with a side face of an outer edge of the first frame area of the display panel; or, the adhesive coating layer is further coated on a side face of an outer edge of the display panel.

8. The tiled display screen according to claim 5, wherein, a width D of a seam between the at least two sub-display screens that are tiled to one another meets: $D=D1+D2+D\Delta$, wherein D1 is a frame width of a first frame area in one of two adjacent sub-display panels; D2 is a frame width of a first frame area of the other one of the two adjacent sub-display panels; $D\Delta$ is a tolerance for a tiled assembly of the two adjacent sub-display screens.

* * * * *